(12) United States Patent
Lee et al.

(10) Patent No.: US 10,476,014 B2
(45) Date of Patent: Nov. 12, 2019

(54) COMPOSITION, ELECTRONIC DEVICE, AND THIN FILM TRANSISTOR

(71) Applicant: Samsung Electronics Co., Ltd., Suwon-si, Gyeonggi-do (KR)

(72) Inventors: Eun Kyung Lee, Seoul (KR); Jiyoung Jung, Seoul (KR); Jeong Il Park, Seongnam-si (KR); Ajeong Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 768 days.

(21) Appl. No.: 14/953,884

(22) Filed: Nov. 30, 2015

(65) Prior Publication Data
US 2016/0155968 A1 Jun. 2, 2016

(30) Foreign Application Priority Data

Dec. 1, 2014 (KR) .......... 10-2014-0169673

(51) Int. Cl.
| | |
|---|---|
| H01L 51/05 | (2006.01) |
| H01L 51/10 | (2006.01) |
| C08F 30/08 | (2006.01) |
| C08L 43/04 | (2006.01) |
| C09D 183/08 | (2006.01) |

(Continued)

(52) U.S. Cl.
CPC ............ *H01L 51/052* (2013.01); *C08F 30/08* (2013.01); *C08L 43/04* (2013.01); *C08L 83/08* (2013.01); *C08L 83/10* (2013.01); *C09D 4/00* (2013.01); *C09D 183/08* (2013.01); *C09D 183/10* (2013.01); *H01L 51/0537* (2013.01); *C08G 77/14* (2013.01); *C08G 77/20* (2013.01); *C08G 77/26* (2013.01); *C08G 77/442* (2013.01); *H01L 51/0074* (2013.01); *H01L 51/0545* (2013.01)

(58) Field of Classification Search
CPC ...... C08F 30/08; C08F 220/18; H01L 51/052; H01L 51/0545; H01L 51/0094; H01L 33/56; H01L 51/0537; H01L 2251/5369; H01L 27/3258; C08L 43/04; C08L 33/10; C08L 33/08; C08L 83/04
See application file for complete search history.

(56) References Cited

U.S. PATENT DOCUMENTS

| | | |
|---|---|---|
| 8,017,245 B2 | 9/2011 | Lee et al. |
| 8,043,701 B2 | 10/2011 | Edelmann et al. |

(Continued)

FOREIGN PATENT DOCUMENTS

| | | |
|---|---|---|
| CN | 1969023 A | 5/2007 |
| CN | 104140733 A | 11/2014 |

(Continued)

OTHER PUBLICATIONS

Non-Final Office Action dated Jun. 8, 2017 for corresponding U.S. Appl. No. 15/239,424.

(Continued)

*Primary Examiner* — Caridad Everhart
(74) *Attorney, Agent, or Firm* — Harness, Dickey & Pierce, P.L.C.

(57) ABSTRACT

A composition includes a product of a condensation reaction between a thermal cross-linking agent and a product of hydrolysis and condensation polymerization of a compound represented by Chemical Formula 1.

18 Claims, 7 Drawing Sheets

(51) Int. Cl.

| | | |
|---|---|---|
| *C09D 183/10* | (2006.01) | |
| *C08L 83/08* | (2006.01) | |
| *C08L 83/10* | (2006.01) | |
| *C09D 4/00* | (2006.01) | |
| *C08G 77/14* | (2006.01) | |
| *C08G 77/20* | (2006.01) | |
| *C08G 77/26* | (2006.01) | |
| *C08G 77/442* | (2006.01) | |
| *H01L 51/00* | (2006.01) | |

(56) References Cited

U.S. PATENT DOCUMENTS

| | | | |
|---|---|---|---|
| 8,124,964 B2 | 2/2012 | Takimiya et al. | |
| 8,138,355 B2 | 3/2012 | Watanabe | |
| 8,153,267 B2 | 4/2012 | Jeong et al. | |
| 8,222,690 B2 | 7/2012 | Ohtani et al. | |
| 8,232,546 B2 | 7/2012 | Takimiya et al. | |
| 8,314,460 B2 | 11/2012 | Ohtani et al. | |
| 8,492,496 B2 | 7/2013 | Kumar et al. | |
| 9,303,180 B2 | 4/2016 | Yamada et al. | |
| 9,431,619 B2 | 8/2016 | Lee et al. | |
| 2002/0098243 A1 | 7/2002 | Edelmann et al. | |
| 2004/0198882 A1* | 10/2004 | Fujita | C08K 3/34 524/261 |
| 2005/0259212 A1 | 11/2005 | Lee et al. | |
| 2006/0063002 A1 | 3/2006 | Edelmann et al. | |
| 2006/0147715 A1 | 7/2006 | Lee et al. | |
| 2007/0045700 A1 | 3/2007 | Ohtani et al. | |
| 2007/0049659 A1 | 3/2007 | Quay | |
| 2007/0085113 A1 | 4/2007 | Wu et al. | |
| 2007/0145357 A1 | 6/2007 | Wu et al. | |
| 2007/0266896 A1 | 11/2007 | Suwa et al. | |
| 2008/0166493 A1 | 7/2008 | Xiao et al. | |
| 2010/0323570 A1* | 12/2010 | Kumar | B82Y 30/00 442/59 |
| 2011/0001190 A1 | 1/2011 | Ide et al. | |
| 2011/0068417 A1 | 3/2011 | Murase et al. | |
| 2011/0086946 A1 | 4/2011 | Kotake et al. | |
| 2011/0259464 A1* | 10/2011 | Lacroix | C08F 255/02 138/177 |
| 2012/0132346 A1 | 5/2012 | Chen et al. | |
| 2012/0277339 A1 | 11/2012 | Bajjuri et al. | |
| 2013/0320316 A1 | 12/2013 | Park et al. | |
| 2014/0336329 A1* | 11/2014 | Yamada | C09D 133/14 524/547 |
| 2014/0357827 A1 | 12/2014 | Swier | |
| 2015/0011699 A1* | 1/2015 | Shukla | H01B 3/447 524/548 |
| 2015/0090979 A1 | 4/2015 | Lee et al. | |
| 2015/0168837 A1 | 6/2015 | Loccufier et al. | |
| 2015/0203707 A1 | 7/2015 | Klun et al. | |
| 2015/0203708 A1 | 7/2015 | Klun et al. | |
| 2015/0218294 A1 | 8/2015 | Klun et al. | |
| 2015/0221797 A1 | 8/2015 | Klun et al. | |
| 2015/0232386 A1* | 8/2015 | Vyakaranam | C08L 71/02 523/401 |
| 2016/0013425 A1 | 1/2016 | Takeya et al. | |
| 2016/0013443 A1* | 1/2016 | Takemura | H01L 51/0097 257/40 |

FOREIGN PATENT DOCUMENTS

| | | | |
|---|---|---|---|
| EP | 1760126 A1 | 3/2007 | |
| JP | 2002-265870 A | 9/2002 | |
| JP | 2006-199752 A | 8/2006 | |
| JP | 2007-122029 A | 5/2007 | |
| JP | 2007-277332 A | 10/2007 | |
| JP | 2008298862 A | 12/2008 | |
| JP | 2009-102628 A | 5/2009 | |
| JP | 2009-267134 A | 11/2009 | |
| JP | 2010-147206 A | 7/2010 | |
| JP | 2010-250733 A | 11/2010 | |
| JP | 2011-186069 A | 9/2011 | |
| JP | 2011-187558 A | 9/2011 | |
| JP | 2011246548 A | 12/2011 | |
| JP | 2013-234301 A | 11/2013 | |
| JP | 2013234301 * | 11/2013 | ........... C08J 7/04 |
| JP | 2013-249395 A | 12/2013 | |
| JP | 2014037453 A | 2/2014 | |
| JP | 2014048569 A | 3/2014 | |
| JP | 2014-82467 A | 5/2014 | |
| KR | 2005-0036171 A | 4/2005 | |
| KR | 2007-0024375 A | 3/2007 | |
| KR | 2008-0002542 A | 1/2008 | |
| KR | 10-0884357 B1 | 2/2009 | |
| KR | 2010-0026154 A | 3/2010 | |
| KR | 2010-0077798 A | 7/2010 | |
| KR | 2010-0114046 A | 10/2010 | |
| KR | 2010-0126407 A | 12/2010 | |
| KR | 2011-0101073 A | 9/2011 | |
| KR | 2011-0106429 A | 9/2011 | |
| KR | 2014-0070476 A | 6/2014 | |
| KR | 2015-0035370 A | 4/2015 | |
| WO | WO-2008/026602 A1 | 3/2008 | |
| WO | WO 20091009790 A1 | 1/2009 | |
| WO | WO-2009/116373 A1 | 9/2009 | |
| WO | WO-2010/044332 A1 | 4/2010 | |
| WO | WO-2013182328 A1 | 12/2013 | |
| WO | WO-2014025387 A1 | 2/2014 | |
| WO | WO-2014/136827 A1 | 9/2014 | |

OTHER PUBLICATIONS

Final Office Action dated Jul. 28, 2017 for corresponding U.S. Appl. No. 14/919,116.
Office Action for corresponding U.S. Appl. No. 15/239,424 dated Nov. 13, 2017.
Office Action for corresponding U.S. Appl. No. 14/919,116 dated Mar. 9, 2018.
Irini D. Sideridou, et al. "Effect of the Structure of Silane-Coupling Agent on Dynamic Mechanical Properties of Dental Resin-Nanocomposites," Journal of Applied Polymer Science vol. 110(1), 507-516 (2008).
H.-J. Gläsal, Radiation-cured polymeric nanocomposites of enhanced surface-mechanical properties, 2003, 303-308 pages, Elsevier B.V.
Jérôme Douce, Effect of filler size and surface condition of nano-sized silica particles in polysiloxane coatings, May 2004, 114-122 pages, Elsevier B.V.
Ying-Ling Liu, Poly(dimethylsiloxane) Star Polymers Having Nanosized Silica Cores, Macromol. Rapid Commun., Jun. 2004, 1392-1395 pages, Wiley-VCH Verlag GmbH & Co. KGaG, Weinheim.
Anubha Goyal, Metal salt induced synthesis of hybrid metal core-siloxane shell nanoparticles and siloxane nanowires, Chem. Commun., Jan. 2010, 964-966 pages, The Royal Society of Chemistry.
Hwa Sung Lee, Interpenetrating polymer network dielectrics for high-performance organic field-effect transistors, Journal of Materials Chemistry, Mar. 2011, 6968-6974 pages, The Royal Society of Chemistry.
Sunho Jeong, Photopatternable Organosiloxane-Based Inorganic-Organic $SiO_2$—$ZrO_2$ Hybrid Dielectrics for Organic Thin Film Transistors, The Journal of Physical Chemistry Letters, Sep. 2007, 16083-16087 pages, American Chemical Society.
U.S. Office Action dated Jan. 27, 2017 issued in co-pending U.S. Appl. No. 14/919,116.
Extended European Search Report dated Jan. 9, 2017 issued in corresponding European Patent Application No. 16184792.6.
Extended European Search Report dated Mar. 8, 2016 issued in corresponding European Patent Application No. 15197322.9.
Final Office Action for co-pending U.S. Appl. No. 14/919,116 dated Oct. 4, 2018.
Notice of Allowance and Fee(s) Due for U.S. Appl. No. 14/919,116 dated Mar. 11, 2019.
Office Action dated Dec. 5, 2018 for corresponding Chinese Application No. 20150862159.9 and English translation.

(56) References Cited

OTHER PUBLICATIONS

Notice of Allowance and Fee(s) Due for co-pending U.S. Appl. No. 14/919,116 dated Jan. 9, 2019.

* cited by examiner

COMPOSITION, ELECTRONIC DEVICE, AND THIN FILM TRANSISTOR

CROSS REFERENCE TO RELATED APPLICATION

This application claims priority to and the benefit of Korean Patent Application No. 10-2014-0169673 filed in the Korean Intellectual Property Office on Dec. 1, 2014, the entire contents of which are incorporated herein by reference.

BACKGROUND

1. Field

Example embodiments relate to a composition, an electronic device including the composition, and a thin film transistor.

2. Description of the Related Art

A flat panel display (e.g., a liquid crystal display (LCD), an organic light emitting diode (OLED) display, and/or an electrophoretic display) includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pair of the electric field-generating electrodes is commonly connected to a switching device and receives an electrical signal, and the electrical optical active layer transforms the electrical signal into an optical signal and thus displays an image.

The flat panel display includes a thin film transistor panel having a thin film transistor (TFT), which is a three-terminal element as a switching device, a gate line transmitting a scan signal for controlling the thin film transistor, and a data line transmitting a signal applied to a pixel electrode.

The thin film transistor may have characteristics, for example, mobility, a leakage current, and an $I_{on}/I_{off}$ ratio, and/or performance of a gate insulator contacting a semiconductor, determined by various factors.

SUMMARY

Example embodiments provide a composition capable of being applied as a gate insulator having relatively high transparency, relatively high heat resistance, and thus relatively high reliability, as well as being capable of being crosslinked by heat and light to be patternable.

Example embodiments provide an electronic device including a cured material of the composition.

Example embodiments provide a thin film transistor including a cured material of the composition.

According to example embodiments, a composition includes a product of a condensation reaction between a thermal cross-linking agent and a product of hydrolysis and condensation polymerization of a compound represented by Chemical Formula 1:

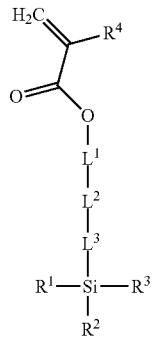

[Chemical Formula 1]

In Chemical Formula 1, $R^1$, $R^2$, and $R^3$ are independently one of hydrogen, a substituted or unsubstituted $C_1$ to $C_{20}$ alkyl group, a $C_1$ to $C_{20}$ substituted or unsubstituted alkoxy group, a $C_1$ to $C_{20}$ substituted or unsubstituted hydroxy group, a halogen, a carboxyl group, a substituted or unsubstituted $C_3$ to $C_{20}$ cycloalkyl group, a substituted or unsubstituted $C_6$ to $C_{20}$ aryl group, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, a substituted or unsubstituted $C_2$ to $C_{20}$ alkynyl group, and a combination thereof, provided that at least one of $R^1$, $R^2$, and $R^3$ is one of a $C_1$ to $C_{20}$ alkoxy group, a hydroxyl group, a halogen, and a carboxyl group, $R^4$ is one of hydrogen and a $C_1$ to $C_{20}$ alkyl group, $L^1$ and $L^3$ are independently one of a substituted or unsubstituted $C_1$ to $C_{20}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ alkenylene group, a substituted or unsubstituted $C_2$ to $C_{20}$ alkynylene group, —R—O—R'—, —R—N—R'—, —R—(C=O)—R'— (wherein, R and R' are independently $C_1$ to $C_{10}$ hydrocarbon radical), and a combination thereof, and $L^2$ is one of —O—(C=O)—NR"—, —(C=O)—NR"— (wherein, R" is one of hydrogen and a $C_1$ to $C_6$ hydrocarbon radical), —O—, —COO—, and —S—.

In Chemical Formula 1, $R^1$, $R^2$, and $R^3$ may be independently a $C_1$ to $C_6$ alkoxy group.

In Chemical Formula 1, $L^1$ and $L^3$ may be independently a $C_1$ to $C_{20}$ alkylene group.

In Chemical Formula 1, $L^2$ may be —(C=O)—NR"— (wherein, R" is one of hydrogen and a $C_1$ to $C_6$ hydrocarbon radical).

In Chemical Formula 1, $R^4$ may be one of hydrogen and a methyl group.

The thermal cross-linking agent may be at least one metal acetate compound, the metal selected from a group consisting of aluminum (Al), zirconium (Zr), titanium (Ti), magnesium (Mg), hafnium (Hf), and tin (Sn).

The thermal cross-linking agent may be at least one selected from a group consisting of aluminum acetoacetate, zirconium acetoacetate, titanium acetoacetate, magnesium acetoacetate, hafnium acetoacetate, and tin acetoacetate.

The thermal cross-linking agent may be included in an amount of less than or equal to about 40 parts by weight based on 100 parts by weight of the product of hydrolysis and condensation polymerization of the compound represented by Chemical Formula 1.

The thermal cross-linking agent may be included in an amount of about 0.01 to about 30 parts by weight based on 100 parts by weight of the product of hydrolysis and condensation polymerization of the compound represented by Chemical Formula 1.

The composition may further include a nanoparticle linked to the product of hydrolysis and condensation polymerization of the compound represented by Chemical Formula 1 through chemical bonding.

The nanoparticle may include at least one selected from a group consisting of silica, titania, barium titanate, zirconia, barium sulfate, alumina, hafnium oxide, and a combination thereof.

The nanoparticle and the product of hydrolysis and condensation polymerization of the compound represented by Chemical Formula 1 may form a three dimensional network structure through chemical bonding.

The nanoparticle and the product of hydrolysis and condensation polymerization of the compound represented by Chemical Formula 1 may form a core-shell structure.

The nanoparticle may be included in an amount of less than or equal to about 40 parts by weight based on 100 parts by weight of the product of hydrolysis and condensation polymerization of the compound represented by Chemical Formula 1. The composition may further include at least one selected from a group consisting of a photo-initiator, a photo acid generator, and a dispersing agent.

According to example embodiments, an electronic device includes a cured material of the composition of example embodiments.

The electronic device may be at least one selected from a group consisting of a solid lighting device, a display device, and a combination thereof.

The solid lighting device may include at least one selected from a group consisting of a semiconductor light-emitting diode, an organic light-emitting diode, and a polymer light-emitting diode.

The display device may include at least one selected from a group consisting of an electronic paper, a liquid crystal display, an organic light-emitting diode display, and a quantum dot display.

According to example embodiments, a thin film transistor includes a gate electrode, a semiconductor overlapping the gate electrode, an insulator between the gate electrode and the semiconductor, the insulator including a cured material of the composition of example embodiments, and a source electrode and a drain electrode electrically connected to the semiconductor.

The semiconductor may be an organic semiconductor.

DETAILED DESCRIPTION

Figure 1:
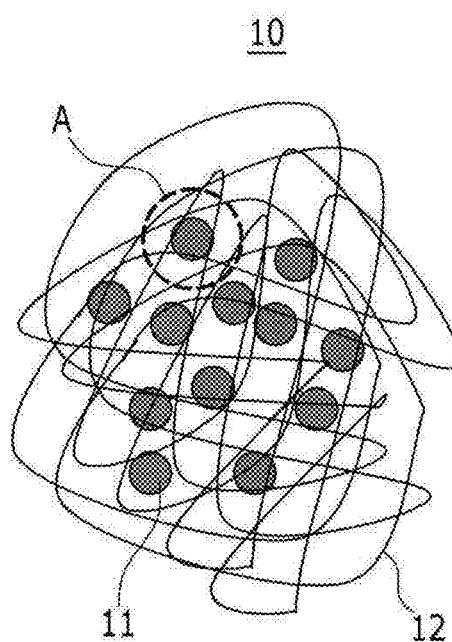
FIG. 1 is a schematic view showing a nanoparticle-polyorganosiloxane composite according to example embodiments.

The present disclosure will be described more fully hereinafter with reference to the accompanying drawings, in which example embodiments are shown. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an insulating composition according to example embodiments is described.

An insulating composition according to example embodiments includes a product of a condensation reaction between a thermal cross-linking agent and a product of hydrolysis and condensation polymerization of a compound represented by Chemical Formula 1:

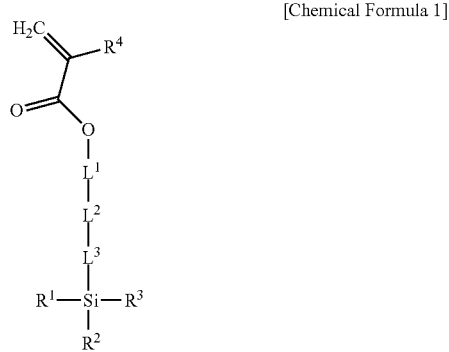

[Chemical Formula 1]

In Chemical Formula 1, $R^1$, $R^2$, and $R^3$ are independently one of hydrogen, a substituted or unsubstituted $C_1$ to $C_{20}$ alkyl group, a $C_1$ to $C_{20}$ substituted or unsubstituted alkoxy group, a $C_1$ to $C_{20}$ substituted or unsubstituted hydroxy group, a halogen, a carboxyl group, a substituted or unsubstituted $C_3$ to $C_{20}$ cycloalkyl group, a substituted or unsubstituted $C_6$ to $C_{20}$ aryl group, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, a substituted or unsubstituted $C_2$ to $C_{20}$ alkynyl group, and a combination thereof, provided that at least one of $R^1$, $R^2$, and $R^3$ is one of a $C_1$ to $C_{20}$ alkoxy group, a hydroxyl group, a halogen, and a carboxyl group, $R^4$ is one of hydrogen and a $C_1$ to $C_{20}$ alkyl group, $L^1$ and $L^3$ are independently one of a substituted or unsubstituted $C_1$ to $C_{20}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ alkenylene group, a substituted or unsubstituted $C_2$ to $C_{20}$ alkynylene group, —R—O—R'—, —R—N—R'—, —R—(C=O)—R'— (wherein, R and R' are independently $C_1$ to $C_{10}$ hydrocarbon radical), and a combination thereof, and $L^2$ is one of —O—(C=O)—NR"—, —(C=O)—NR"— (wherein, R" is one of hydrogen and a $C_1$ to $C_6$ hydrocarbon radical), —O—, —COO—, and —S—.

The compound represented by Chemical Formula 1 includes a silane functional group at an end and an acrylic group at another end. Accordingly, the compound represented by Chemical Formula 1 may form a polyorganosiloxane having a network structure by chemical bonding between the silane functional groups through hydrolysis and condensation/polymerization. Further, the compound represented by Chemical Formula 1 may be photo cross-linked by the acrylic groups. In this way, the compound represented by Chemical Formula 1 may form a polyorganosiloxane having a dense net structure through photo cross-linking, hydrolysis, and condensation/polymerization reactions among the compounds.

Further, the compound represented by Chemical Formula 1 includes linking groups represented by $L^1$, $L^2$, and $L^3$ between the silane functional group and the acrylic group, and thus can maintain stability of the composition including the compound represented by Chemical Formula 1. Without the linking groups, storage stability of the compound including both the silane functional group and the acrylic group may not be guaranteed due to the relatively high reactivity between the compounds.

In Chemical Formula 1, at least one of $R^1$, $R^2$, and $R^3$ may be a $C_1$ to $C_6$ alkoxy group. For example, $R^1$, $R^2$, and $R^3$ may independently be a $C_1$ to $C_6$ alkoxy group.

The $C_1$ to $C_6$ alkoxy group may be methoxy or ethoxy group, and is not limited thereto.

If all of $R^1$, $R^2$, and $R^3$ are independently one of a $C_1$ to $C_{20}$ alkoxy group, hydroxyl group, halogen, or a carboxyl group, the polyorganosiloxane obtained by hydrolysis and condensation/polymerization reactions among the compound represented by Chemical Formula 1 may include a structural unit represented by Chemical Formula 2:

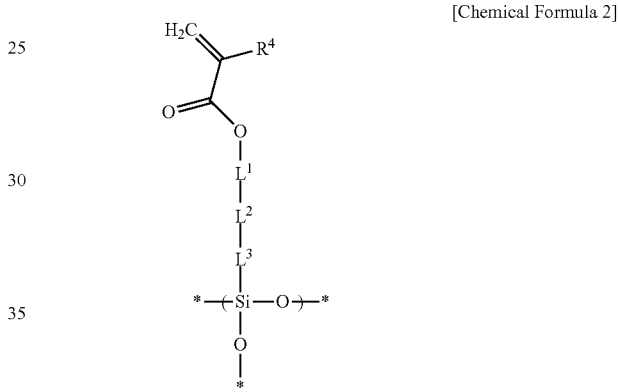

[Chemical Formula 2]

In Chemical Formula 2, R4 and L1 to L3 are defined as in Chemical Formula 1.

The polyorganosiloxane represented by Chemical Formula 2 may be cured to a denser polyorganosiloxane as the acrylic groups at an end are cross-linked through a photo curing reaction.

In example embodiments, $R^1$, $R^2$, and $R^3$ in Chemical Formula 1 may independently be a $C_1$ to $C_6$ alkoxy group, for example, a methoxy or an ethoxy, but are not limited thereto.

In Chemical Formulae 1 and 2, $L^1$ and $L^3$ may independently be a $C_1$ to $C_{20}$ alkylene group, but are not limited thereto.

In Chemical Formulae 1 and 2, $L^2$ may be —(C=O)—NR"—, wherein R" is hydrogen or a $C_1$ to $C_6$ hydrocarbon radical, but is not limited thereto.

In Chemical Formulae 1 and 2, $R^4$ may be hydrogen or methyl group, but is not limited thereto.

The thermal cross-linking agent may perform a condensation reaction with an unreacted silanol group of a polyorganosiloxane, which is a product of hydrolysis and a condensation polymerization of the compound represented by Chemical Formula 1. In this way, a denser three dimensional network structure is formed, as a metal particle derived from the thermal cross-linking agent is further crosslinked to the polyorganosiloxane, and a more stable product may be obtained by reducing unreacted silanol groups therein.

The thermal cross-linking agent may be at least one acetate compound of a metal selected from a group consisting of aluminum (Al), zirconium (Zr), titanium (Ti), magnesium (Mg), hafnium (Hf), and tin (Sn). For example, the thermal cross-linking agent may be at least one selected from a group consisting of aluminum acetoacetate, zirconium acetoacetate, titanium acetoacetate, magnesium acetoacetate, hafnium acetoacetate, and tin acetoacetate, but is not limited thereto.

The thermal cross-linking agent may be included in an amount of less than or equal to about 40 parts by weight based on 100 parts by weight of the product of hydrolysis and condensation polymerization of a compound represented by Chemical Formula 1, and may perform condensation reaction with the product of hydrolysis and condensation polymerization of a compound represented by Chemical Formula 1. For example, the thermal cross-linking agent may be included in an amount of about 0.01 to about 30 parts by weight, for example, in an amount of about 0.03 to about 25 parts by weight, based on 100 parts by weight of the product of hydrolysis and condensation polymerization of a compound represented by Chemical Formula 1.

The composition may further include a nanoparticle linked to the product of hydrolysis and condensation polymerization of a compound represented by Chemical Formula 1 through chemical bonding.

The nanoparticle is not particularly limited as long as it has a several nanometers to tens of nanometers average particle diameter, and, for example, may be a metal oxide. The metal oxide may be, for example, silica, titania, barium titanate, zirconia, barium sulfate, alumina, hafnium oxide, or a combination thereof, but is not limited thereto.

The nanoparticle may be, for example, in a sol state (referred to as 'nano-sol').

The nano-sol may have a reaction site on a surface of the nanoparticle, which is, for example, at least one selected from hydroxyl group, alkoxy group, halogen, carboxyl group, and a combination thereof, at which a condensation/polymerization reaction may take place.

Accordingly, the chemical bonding between the nanoparticle and the product of hydrolysis and condensation polymerization of the compound represented by Chemical Formula 1 may also be formed via, for example, a condensation/polymerization reaction at the reaction site of the nano-sol during the process of preparing a polyorganosiloxane having a chain structure and/or a net structure through hydrolysis and condensation reaction of the compounds represented by Chemical Formula 1. In this way, the nanoparticle and the product of hydrolysis and condensation polymerization of a compound represented by Chemical Formula 1 may form a nanoparticle-polyorganosiloxane composite having a three dimensional network structure through chemical bonding.

The nanoparticle-polyorganosiloxane composite may have a larger average particle diameter than the nanoparticle, and for example, may have an average particle diameter of about 2 nm to about 200 nm.

Figure 2:
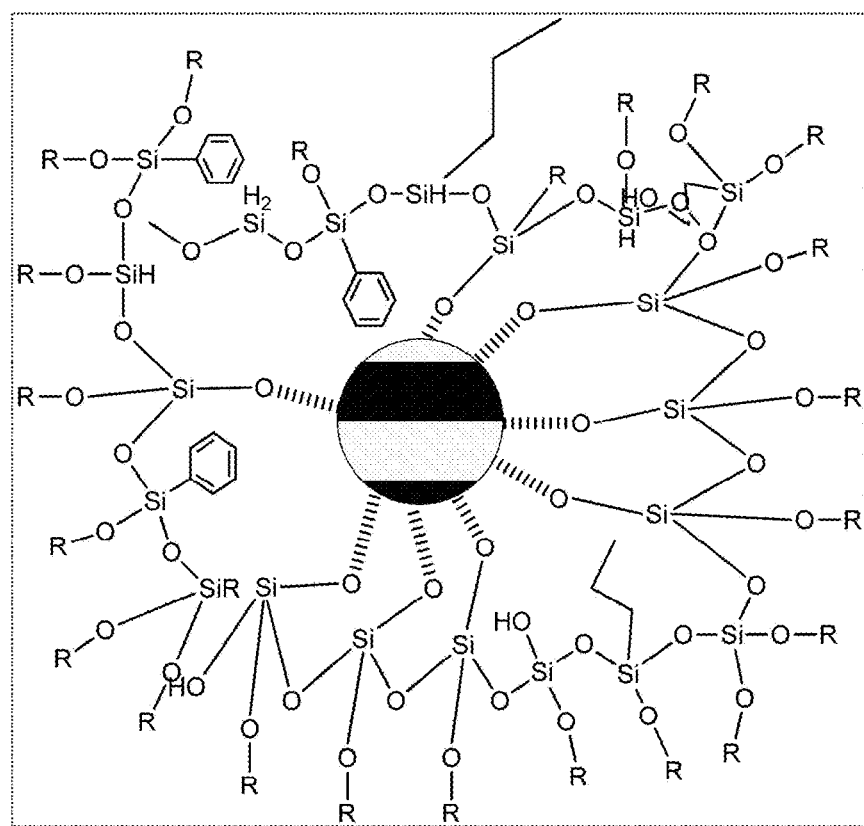
FIG. 2 is a schematic view enlarging a region "A" in FIG. 1.

FIG. 1 is a schematic view showing a nanoparticle-polyorganosiloxane composite according to example embodiments. FIG. 2 enlarges a region "A" in FIG. 1.

Referring to FIG. 1, a nanoparticle-polyorganosiloxane composite 10 according to example embodiments includes a plurality of nanoparticles 11 and polyorganosiloxane 12 chemically bonded with each nanoparticle 11 and randomly disposed therein. The nanoparticle 11 may have, for example, a spherical shape, and the polyorganosiloxane 12 may include a chain structure and/or a net structure. The nanoparticle 11 and the polyorganosiloxane 12 form a three-dimensional network structure through a chemical bond.

Referring to FIG. 2, each nanoparticle 11 has a plurality of bonding sites and is chemically bonded with the polyorganosiloxane 12. For example, each nanoparticle-polyorganosiloxane composite 10 may have a core-shell structure where the polyorganosiloxane 12 surrounds the nanoparticle 11, but is not limited thereto. In FIG. 2, the polyorganosiloxane is abbreviated as 'R', except for the silane functional group.

The nanoparticle may be included in an amount of less than or equal to about 40 parts by weight, for example, from about 1 parts by weight to about 30 parts by weight, for example, from about 2 parts by weight to about 20 parts by weight, for example, from about 2 parts by weight to about 10 parts by weight, based on 100 parts by weight of the product of hydrolysis and condensation polymerization of the compound represented by Chemical Formula 1.

The composition may further include at least one selected from a group consisting of a photo initiator, a photo acid generator, and a dispersing agent.

By including a photo initiator and/or a photo acid generator, photo cross-linking between the acrylic groups at an end of the polyorganosiloxane is promoted when the composition is coated on a substrate and subjected to a photo curing.

The composition may further include a solvent. By further including a solvent, viscosity of the composition may appropriately be adjusted.

The solvent is not particularly limited, and may be, for example, an aliphatic hydrocarbon solvent (e.g., hexane); an aromatic hydrocarbon solvent (e.g., anisole, mesitylene, and/or xylene); a ketone based solvent (e.g., methylisobutylketone, 1-methyl-2-pyrrolidinone, and/or acetone); an ether based solvent (e.g., cyclohexanone, tetrahydrofuran, and/or isopropylether); an acetate based solvent (e.g., ethylacetate, butylacetate, and/or propylene glycolmethyletheracetate); an alcohol-based solvent (e.g., isopropylalcohol and/or butanol); an amide-based solvent (e.g., dimethylacetamide and/or dimethylformamide); a silicone-based solvent; or a combination thereof.

The composition is coated on a substrate or a lower layer and subjected to a photo cure to become a cured material. With the aid of the photo cure, the acrylic groups of the polyorganosiloxane may be photo cured, whereby the polyorganosiloxane can have a denser film property.

In this way, the composition according to example embodiments may have improved insulator properties, such as, for example, relatively high insulating strength, relatively high dielectric constant, relatively high thermal resistance, relatively high chemical resistance, relatively long time stability, etc., when applied to an insulator, as the compound represented by Chemical Formula 1 forms a polyorganosiloxane having a relatively dense network structure. Therefore, when the insulator is used as a gate insulator for a thin film transistor, a leakage current may be reduced and the properties of a thin film transistor may be improved due to the desirable film properties and relatively high insulation strength.

Further, as the insulator is an organic/inorganic composite insulator, the insulator can be simply formed in a solution process, unlike an inorganic insulator.

The insulator may be used in a field requiring insulation characteristics of an electronic device, for example, as a gate insulator, a dielectric material, and/or a filler.

Further, the composition may be photo cured, and it is possible to form a pattern by coating the composition on a substrate, drying the same, placing a mask having a predetermined or given pattern thereon, and irradiating the same. In this way, the irradiated part is cured to form a cured material, while the part that is not irradiated is washed out by a developer, to form a predetermined or given pattern. In this case, the cured material prepared from the composition may have a high resolution of, for example, less than or equal to about 100 µm, for example, less than or equal to about 50 µm, for example, less than or equal to about 30 µm, for example, less than or equal to about 20 µm, for example, less than or equal to about 10 µm. Accordingly, the cured material may efficiently be used as a planarization film, a protective film, a barrier film, etc., and is not limited thereto.

Accordingly, an electronic device according to example embodiments includes a cured material obtained by curing the composition according to the above example embodiments.

The electronic device may be at least one selected from a group consisting of a solid lightning device, a display device, and a combination thereof.

The solid lighting device may include at least one selected from a group consisting of a semiconductor light-emitting diode, an organic light-emitting diode, and a polymer light-emitting diode, but is not limited thereto.

The display device may include at least one selected from a group consisting of an electronic paper, a liquid crystal display, an organic light-emitting diode display, and a quantum dot display, but is not limited thereto.

Figure 3:
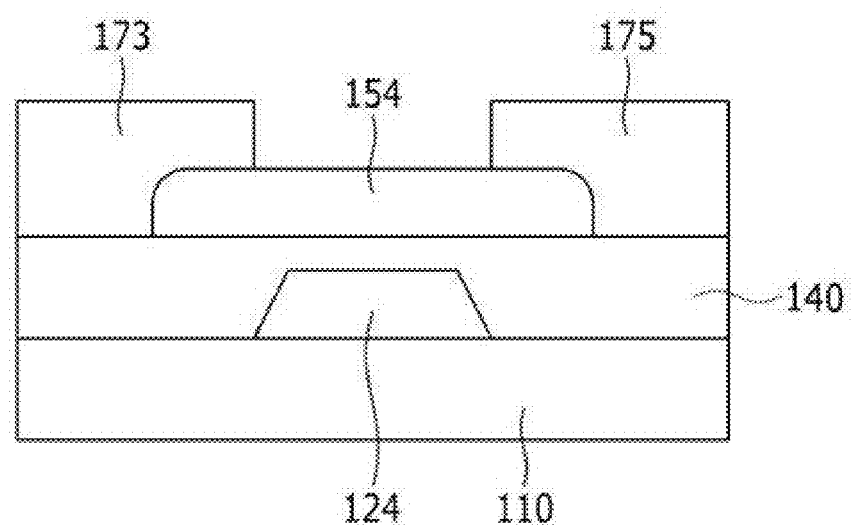
FIG. 3 is a cross-sectional view showing a thin film transistor panel according to example embodiments.

Hereinafter, a thin film transistor including the insulator is described. FIG. 3 is a cross-sectional view showing a thin film transistor according to example embodiments.

Referring to FIG. 3, a thin film transistor according to example embodiments includes a gate electrode 124 disposed on a substrate 110, a semiconductor 154 overlapping the gate electrode 124, a gate insulator 140 interposed between the gate electrode 124 and the semiconductor 154, and a source electrode 173 and a drain electrode 175 that are electrically connected to the semiconductor 154.

The substrate 110 may be made of, for example, transparent glass, silicon, or a polymer. The gate electrode 124 is connected to a gate line (not shown) transmitting a data signal, and may be made of, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

The semiconductor 154 may be an organic semiconductor or an inorganic semiconductor, and is, for example, an organic semiconductor. The organic semiconductor may be, for example, at least one selected from pentacene and a precursor thereof, tetrabenzoporphyrin and a derivative thereof, polyphenylenevinylene and a derivative thereof, polyfluorene and a derivative thereof, polythienylenevinylene and a derivative thereof, polythiophene and a derivative thereof, polythienothiophene and a derivative thereof, polyarylamine and a derivative thereof, phthalocyanine and a derivative thereof, metallized phthalocyanine and a halogenated derivative thereof, perylenetetracarboxylic dianhydride (PTCDA), naphthalenetetracarboxylic dianhydride (NTCDA) or an imide derivative thereof, perylene or coronene and substituent-containing derivatives thereof, but is not limited thereto.

The gate insulator 140 may be prepared from the above composition, for example, by coating the above composition, photo-curing, and/or thermally curing it to prepare a film.

The source electrode 173 and the drain electrode 175 face each other with the semiconductor 154 therebetween, and are electrically connected to semiconductor 154. The source electrode 173 is connected to a data line (not shown) transmitting a data signal. The source electrode 173 and the drain electrode 175 may be, for example, made of gold (Au), copper (Cu), nickel (Ni), aluminum (Al), molybdenum (Mo), chromium (Cr), tantalum (Ta), titanium (Ti), an alloy thereof and a combination thereof, but are not limited thereto.

The thin film transistor may be applied to various electronic devices, for example, a semiconductor device, a flat panel display, an energy device, and a sensor. The electronic device may include, for example, a liquid crystal display (LCD), an organic light emitting diode (OLED) device, a solar cell, and an organic sensor.

Hereinafter, the present disclosure is illustrated in more detail with reference to examples. However, these are examples, and the present disclosure is not limited thereto.

EXAMPLES

Synthesis of Insulating Composition

Example 1

Synthesis of Product of Condensation Reaction Between Polyorganosiloxane and Thermal Cross-linking Agent 1000 g of methanol is put into a reactor equipped with a reflux cooler that is capable of agitation and made of a glass material, and 672.8 g of the silane compound represented by the following Chemical Formula 4 is added thereto. The mixture is agitated at room temperature for 1 hour. Then, 56 g of aqueous solution of HCl (0.1 N) is added to the mixture in a dropwise fashion for 2 hours, and agitated at room temperature for another 2 hours to induce hydrolysis reaction. Subsequently, the reaction mixture is heated to 80° C. and further reacted for 36 hours to perform condensation and polymerization reactions to obtain polyorganosiloxane including a structural unit represented by the following Chemical Formula 5. The obtained polyorganosiloxane is measured in a GPC method to determine its weight average molecular weight as 2800, PDI (polydispersity index) as 1.79, viscosity as 5.8 cPs at 20° C., and pH as 7.

[Chemical Formula 4]

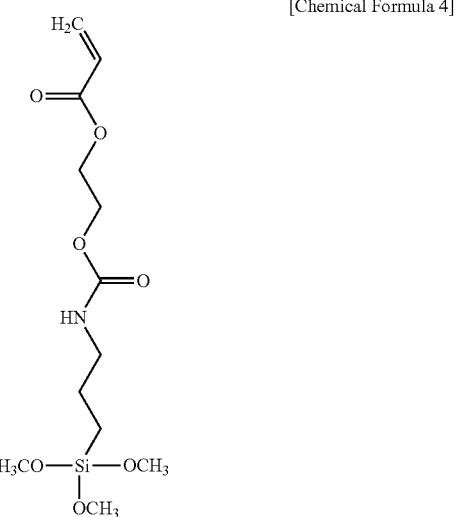

-continued

[Chemical Formula 5]

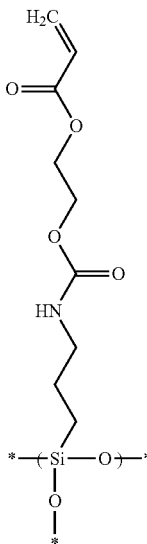

670 g of propyleneglycol monomethyl ether acetic acid is added to the obtained polyorganosiloxane for dilution, and the mixture is distillated under a reduced pressure of 60 cm Hg, at 60° C. to remove a byproduct, obtaining the polyorganosiloxane dispersed in the propyleneglycol monomethyl ether acetic acid. To the dispersed polyorganosiloxane, 1% of aluminum acetoacetate based on the weight of the polyorganosiloxane is added to induce condensation reaction to obtain polyorganosiloxane including alumina.

Example 2

Synthesis of Product of Condensation Reaction Between Nanoparticle-polyorganosiloxane Composite and Thermal Cross-linking Agent 500 g of an aqueous alkaline silica sol is passed through a column charged with a strongly acidic cation exchange resin, obtaining an acidic silica sol having pH 2. 500 g of the obtained acidic silica sol is put into a reactor equipped with a reflux cooler that is capable of agitation and made of a glass material, and 1000 g of methanol is added thereto for dilution. Subsequently, 11 g of glycidoxypropyl trimethoxysilane is added thereto, the mixture is agitated at room temperature for 1 hour, and then heated and reacted at 95° C. for 6 hours to perform a surface treatment of silica. Then, the surface-treated silica sol is distillated under a reduced pressure of 50 cmHg, at 80° C., and concentrated to 500 g by removing a part of water included therein. The distillation under a reduced pressure is additionally performed four times under the same conditions after diluting the silica sol by adding 1000 g of methanol thereto until the amount of water therein decreases to less than or equal to 1 wt %. Then, 672.8 g of the silane compound represented by Chemical Formula 4 is added thereto, and the mixture is agitated at room temperature for 1 hour. Following this, 56 g of an aqueous solution of HCl with a concentration of 0.1N is added thereto in a dropwise fashion for 2 hours, and the mixture is additionally agitated at room temperature for 2 hours to perform a hydrolysis reaction. The temperature of the resultant is then increased to 80° C. and the resultant is reacted for 36 hours to perform condensation and polymerization reactions, obtaining a silica-polyorganosiloxane composite with silica positioned in the core and polyorganosiloxane condensed and polymerized as a shell around the silica. The obtained silica-polyorganosiloxane is measured in a GPC method to determine its weight average molecular weight as 1800, PDI (polydispersity index) as 1.34, viscosity as 7.2 cPs at 20° C., and pH as 6.

Subsequently, 335 g of propyleneglycol monomethylether acetic acid is added to the silica-polyorganosiloxane composite for dilution, and the diluted mixture is distillated under a reduced pressure of 60 cmHg at 60° C. to remove a byproduct, obtaining a silica-polyorganosiloxane composite dispersed in the propyleneglycol monomethyl ether acetic acid. To the dispersed silica-polyorganosiloxane composite, is added 1%, based on the weight of the silica-polyorganosiloxane composite, of aluminum acetoacetate to induce condensation reaction to obtain silica-polyorganosiloxane composite to which alumina is crosslinked.

Manufacture of Thin Film Transistor

Preparation Example 1

Manufacture of Thin Film Transistor by Using Product According to Example 1

Molybdenum is sputtered on a glass substrate, and then photolithography is performed to form a gate electrode. Subsequently, the polyorganosiloxane obtained in Example 1 is spin-coated thereon, pre-annealed at 90° C. for 2 minutes, and radiated using a 200 W high pressure mercury lamp having a wavelength region of 240 nm to 400 nm for 96 seconds, followed by a post-annealing at 200° C. for 1 hour.

A heteroacene derivative, dibenzothiopheno[6,5-b:6',5'-f] thieno[3,2-b]thiophene (DBTTT), represented by Chemical Formula 6, is then vacuum-deposited thereon, forming an organic semiconductor. Subsequently, gold (Au) is sputtered on the organic semiconductor, and photolithography is performed to form a source electrode and a drain electrode, manufacturing a thin film transistor.

[Chemical Formula 6]

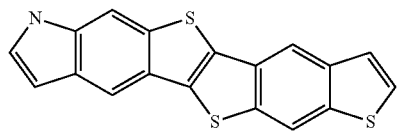

Preparation Example 2

Manufacture of Thin Film Transistor by Using Product According to Example 2

A thin film transistor is manufactured according to the same method as Preparation Example 1, except for using the condensation product of the nanoparticle-polyorganosiloxane composite and thermal cross-linking agent according to Example 2.

Evaluation

Characteristics of the thin film transistors according to Preparation Example 1 and Preparation Example 2 are evaluated. The characteristics of the thin film transistors include insulation strength, charge mobility, and $I_{on}/I_{off}$ ratio.

Figure 4:
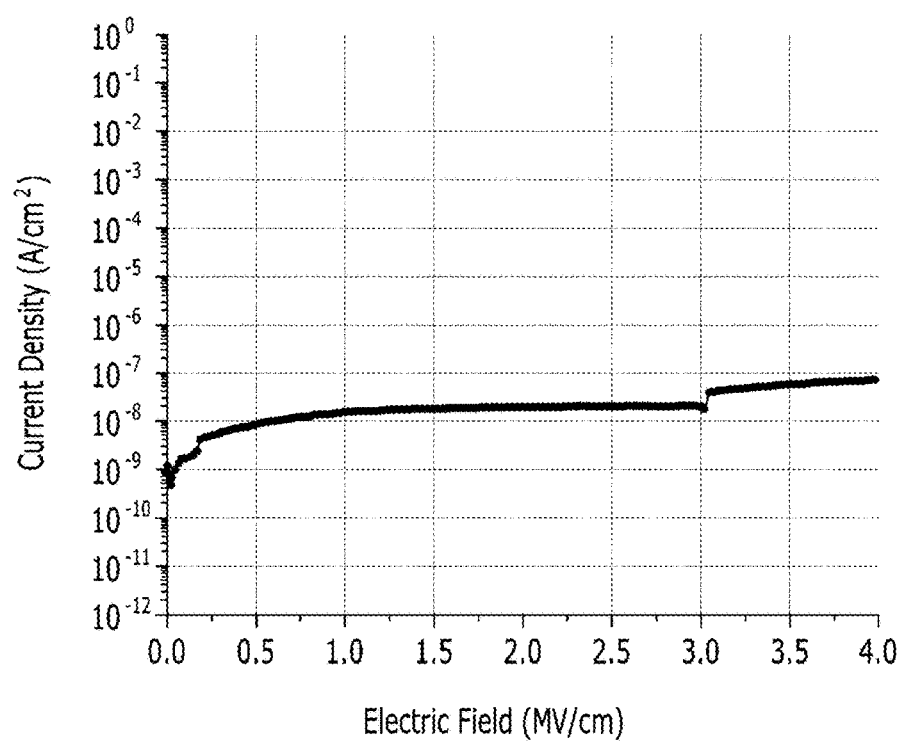
FIG. 4 is a graph showing insulation strength of a thin film transistor according to Preparation Example 1.

FIG. 4 is a graph showing the insulation strength of the thin film transistor according to Preparation Example 1, FIG.

5 is a graph showing the insulation strength of the thin film transistor according to Preparation Example 2.

Figure 5:
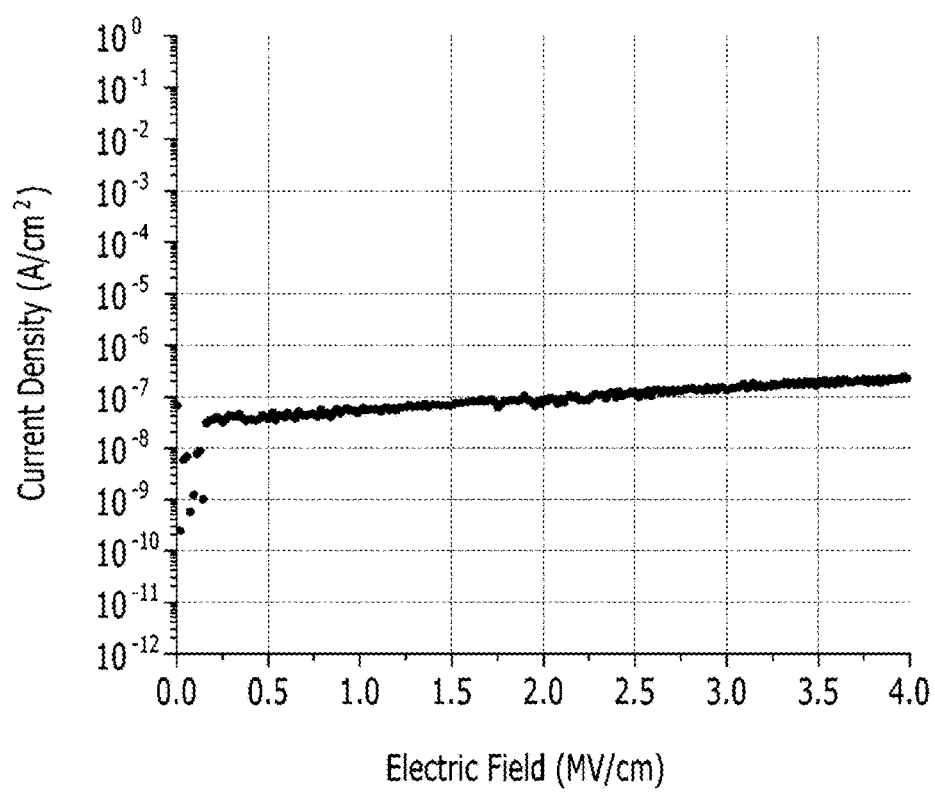
FIG. 5 is a graph showing insulation strength of a thin film transistor according to Preparation Example 2.

Referring to FIGS. 4 and 5, both of the thin film transistors according to Preparation Examples 1 and 2 show improved insulation strengths. That is, the insulation strengths of the insulators in the thin film transistors according to Preparation Examples 1 and 2 are sufficient in the range of, for example, to about 4 mega volts (MV) level, when the current density is in a micro amphere (µA) level. Accordingly, the thin film transistors according to Preparation Examples 1 and 2 have relatively high electrical reliability.

Figure 6:
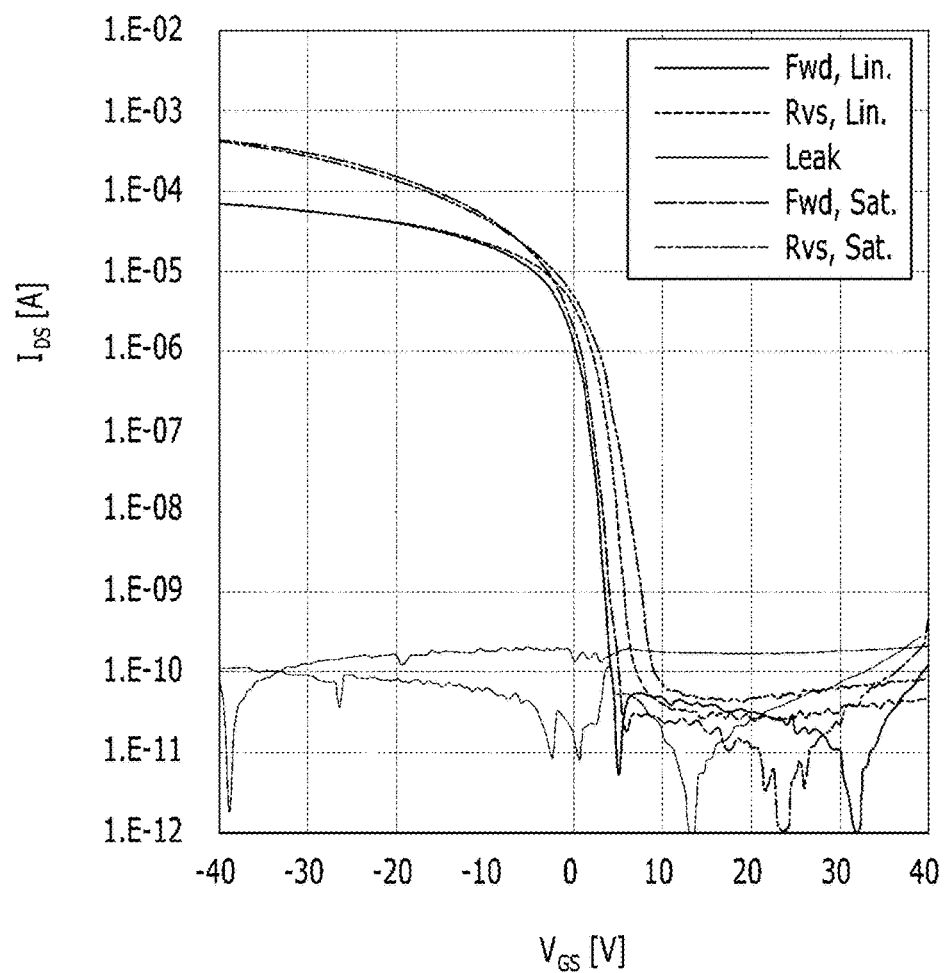
FIG. 6 is a graph showing charge mobility of a thin film transistor according to Preparation Example 1.
Figure 7:
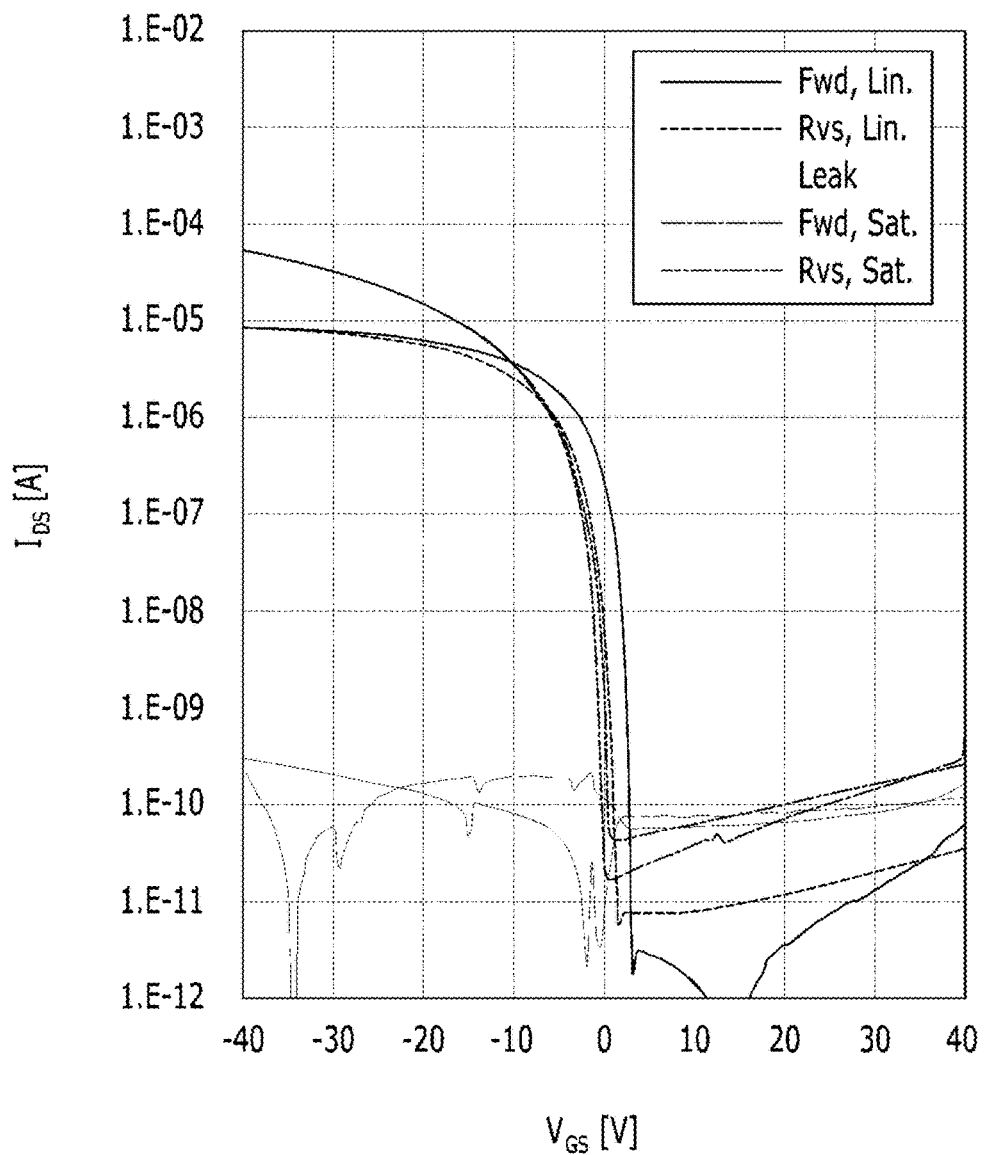
FIG. 7 is a graph showing charge mobility of a thin film transistor according to Preparation Example 2.

FIG. 6 is a graph showing charge mobility in the thin film transistor according to Preparation Example 1. FIG. 7 is a graph showing charge mobility in the thin film transistor according to Preparation Example 2.

The following Table 1 shows charge mobility, on-current value, and off-current value of the thin film transistors according to Preparation Examples 1 and 2.

TABLE 1

| | Charge mobility (cm$^2$/V · s) | On-current value | Off-current value |
|---|---|---|---|
| Preparation Example 1 | 10.29 | $4.86 \times 10^4$ | $3.50 \times 10^{13}$ |
| Preparation Example 2 | 1.9 | $1.03 \times 10^4$ | $6.98 \times 10^{10}$ |

Referring to FIGS. 6 and 7, and Table 1, the thin film transistors according to Preparation Examples 1 and 2 show improved charge mobility, and $I_{on}/I_{off}$ ratio, and thus may be efficiently used as an organic insulator.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims. For example, while the example embodiments only illustrate insulator and thin film transistor including same, persons skilled in the art will understand that the cured material prepared from the composition according to example embodiments may be efficiently used in various articles and electronic materials.

What is claimed is:

1. A composition comprising a product of a condensation reaction between a thermal cross-linking agent and a product of hydrolysis and condensation polymerization of a compound represented by Chemical Formula 1:

[Chemical Formula 1]

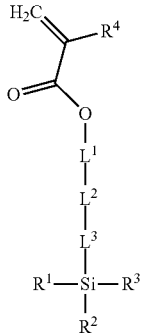

In Chemical Formula 1, each of $R^1$, $R^2$, and $R^3$ are independently one of hydrogen, a substituted or unsubstituted $C_1$ to $C_{20}$ alkyl group, a $C_1$ to $C_{20}$ substituted or unsubstituted alkoxy group, a $C_1$ to $C_{20}$ substituted or unsubstituted hydroxy group, a halogen, a carboxyl group, a substituted or unsubstituted $C_3$ to $C_{20}$ cycloalkyl group, a substituted or unsubstituted $C_6$ to $C_{20}$ aryl group, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, a substituted or unsubstituted $C_2$ to $C_{20}$ alkynyl group, and a combination thereof, provided that at least one of $R^1$, $R^2$, and $R^3$ is one of a $C_1$ to $C_{20}$ alkoxy group, a hydroxyl group, a halogen, and a carboxyl group, $R^4$ is one of hydrogen and a $C_1$ to $C_{20}$ alkyl group, $L^1$ and $L^3$ are independently one of a substituted or unsubstituted $C_1$ to $C_{20}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ alkenylene group, a substituted or unsubstituted $C_2$ to $C_{20}$ alkynylene group, —R—O—R'—, —R—N—R'—, —R—(C=O)—R'— (wherein, R and R' are independently a $C_1$ to $C_{10}$ hydrocarbon radical), and a combination thereof, and $L^2$ is one of —O—(C=O)—NR"—, —(C=O)—NR"— (wherein, R" is one of hydrogen or a $C_1$ to $C_6$ hydrocarbon radical), —O—, —COO—, or —S—; and a nanoparticle linked to the product of hydrolysis and condensation polymerization of the compound represented by Chemical Formula 1 through chemical bonding, wherein the nanoparticle and the product of hydrolysis and condensation polymerization of the compound represented by Chemical Formula 1 form a core-shell structure.

2. The composition according to claim 1, wherein $R^1$, $R^2$, and $R^3$ are independently a $C_1$ to $C_6$ alkoxy group.

3. The composition according to claim 1, wherein $L^1$ and $L^3$ are independently a $C_1$ to $C_{20}$ alkylene group.

4. The composition according to claim 1, wherein $L^2$ is —(C=O)—NR"— (wherein, R" is one of hydrogen and a $C_1$ to $C_6$ hydrocarbon radical).

5. The composition according to claim 1, wherein $R^4$ is one of hydrogen and a methyl group.

6. The composition according to claim 1, wherein the thermal cross-linking agent is included in an amount of less than or equal to about 40 parts by weight based on 100 parts by weight of the product of hydrolysis and condensation polymerization of the compound represented by Chemical Formula 1.

7. The composition according to claim 1, wherein the thermal cross-linking agent is included in an amount of about 0.01 to 30 parts by weight based on 100 parts by weight of the product of hydrolysis and condensation polymerization of the compound represented by Chemical Formula 1.

8. The composition according to claim 1, wherein the nanoparticle and the product of hydrolysis and condensation polymerization of the compound represented by Chemical Formula 1 form a three dimensional network structure through chemical bonding.

9. The composition according to claim 1, wherein the nanoparticle includes at least one selected from a group consisting of silica, titania, barium titanate, zirconia, barium sulfate, alumina, hafnium oxide, and a combination thereof.

10. The composition according to claim 1, wherein the nanoparticle is present in an amount of less than or equal to about 40 parts by weight based on 100 parts by weight of the product of hydrolysis and condensation polymerization of the compound represented by Chemical Formula 1.

11. The composition according to claim 1, further comprising:
at least one selected from a photo-initiator, a photo acid generator, and a dispersing agent.

12. The composition according to claim 1,
wherein the thermal cross-linking agent is at least one selected from a group consisting of aluminum acetoacetate, zirconium acetoacetate, titanium acetoacetate, magnesium acetoacetate, hafnium acetoacetate, and tin acetoacetate.

13. The composition accoriding to claim 12, wherein the thermal cross-linking agent is at least one selected from a group consisting of zirconium acetoacetate, magnesium acetoacetate, hafnium acetoacetate, and tin acetoacetate.

14. An electronic device comprising a cured material of the composition according to claim 1.

15. The electronic device according to claim 14, wherein the electronic device is at least one selected from a group consisting of a solid lighting device, a display device, and a combination thereof.

16. The electronic device according to claim 15, wherein:
the solid lighting device is at least one selected from a group consisting of a semiconductor light-emitting diode, an organic light-emitting diode, and a polymer light-emitting diode; and
the display device is at least one selected from a group consisting of an electronic paper, a liquid crystal display, an organic light-emitting diode display, and a quantum dot display.

17. A thin film transistor, comprising:
a gate electrode;
a semiconductor overlapping the gate electrode;
an insulator between the gate electrode and the semiconductor, the insulator including a cured material of the composition according to claim 1; and
a source electrode and a drain electrode electrically connected to the semiconductor.

18. The thin film transistor of claim 17, wherein the semiconductor is an organic semiconductor.

* * * * *